US011489188B2

(12) United States Patent
Vulliet et al.

(10) Patent No.: US 11,489,188 B2
(45) Date of Patent: Nov. 1, 2022

(54) METHOD FOR MANUFACTURING AN ELECTROLYTE FOR SOLID OXIDE CELLS BY MAGNETRON CATHODE SPUTTERING

(71) Applicants: COMMISSARIAT À L'ÉNERGIE ATOMIQUE ET AUX ÉNERGIES ALTERNATIVES, Paris (FR); CENTRE NATIONAL DE LA RECHERCHE SCIENTIFIQUE, Paris (FR); UNIVERSITE D'ORLEANS, Orleans (FR)

(72) Inventors: Julien Vulliet, Chambray-les-Tours (FR); Anne-Lise Thomann, Menestreau-en-Villette (FR); Pierre-Laurent Coddet, Olivet (FR)

(73) Assignees: COMMISSARIAT À L'ÉNERGIE ATOMIQUE ET AUX ÉNERGIES ALTERNATIVES, Paris (FR); CENTRE NATIONAL DE LA RECHERCHE SCIENTIFIQUE, Paris (FR); UNIVERSITE D'ORLEANS, Orleans (FR)

( * ) Notice: Subject to any disclaimer, the term of this patent is extended or adjusted under 35 U.S.C. 154(b) by 39 days.

(21) Appl. No.: 16/649,796

(22) PCT Filed: Sep. 25, 2018

(86) PCT No.: PCT/FR2018/052360
§ 371 (c)(1),
(2) Date: Mar. 23, 2020

(87) PCT Pub. No.: WO2019/063934
PCT Pub. Date: Apr. 4, 2019

(65) Prior Publication Data
US 2020/0313218 A1 Oct. 1, 2020

(30) Foreign Application Priority Data

Sep. 26, 2017 (FR) .................................... 1758902

(51) Int. Cl.
$C23C\ 14/58$ (2006.01)
$H01M\ 8/1253$ (2016.01)
(Continued)

(52) U.S. Cl.
CPC ......... $H01M\ 8/1253$ (2013.01); $C23C\ 14/083$ (2013.01); $C23C\ 14/35$ (2013.01); $C23C\ 14/5853$ (2013.01); $H01M\ 8/126$ (2013.01)

(58) Field of Classification Search
None
See application file for complete search history.

(56) References Cited

U.S. PATENT DOCUMENTS

2005/0098426 A1* 5/2005 Ranjan ................. C23C 14/085
204/192.2
2016/0351752 A1 12/2016 Kuchiyama et al.

FOREIGN PATENT DOCUMENTS

| CN | 102400102 A | * | 4/2012 | |
|---|---|---|---|---|
| JP | 06102231 A | * | 4/1994 | |
| WO | WO-2010074076 A1 | * | 7/2010 | ............. C23C 14/14 |

OTHER PUBLICATIONS

Machine Translation of Mashimo WO/2010041076A1 / JP2010517624A, (Year: 2010).*
(Continued)

Primary Examiner — Jason Berman
(74) Attorney, Agent, or Firm — Pearne & Gordon LLP (57) ABSTRACT

A method of manufacturing by magnetron cathode sputtering an electrolyte film for use in solid oxide cells (SOC). This method comprises the steps consisting of heating a substrate to a temperature ranging from 200° C. to 1200° C.; followed by subjecting the substrate to at least two treatment
(Continued)

cycles, each treatment cycle comprising: 1) depositing one layer of a metal precursor on the substrate by magnetron cathode sputtering of a target made up of the metal precursor, the sputtering being carried out under elemental sputtering conditions; followed by 2) oxidation-crystallisation of the metal precursor forming the layer deposited on the substrate in the presence of oxygen to obtain the transformation of the metal precursor into the electrolyte material; and in that the substrate is kept at a temperature ranging from 200° C. to 1200° C. for the entire duration of each treatment cycle.

19 Claims, 6 Drawing Sheets

(51) Int. Cl.
*C23C 14/08* (2006.01)
*C23C 14/35* (2006.01)
*H01M 8/126* (2016.01)

(56) References Cited

OTHER PUBLICATIONS

International Search Report for PCT/FR2018/052360 dated Jan. 24, 2019.
Written Opinion for PCT/FR2018/052360 dated Jan. 24, 2019.
International Preliminary Report on Patentability for PCT/FR2018/052360 dated Sep. 2, 2019.
Search Report for French application No. 1758902 dated Jun. 7, 2018.
Pederson L.R. et al. "Application of vacuum deposition methods to solid oxide fuel cells" IN: Vacuum, Pergamon Press, Aug. 3, 2006, vol. 80, No. 10, pp. 1066-1083.
Hidalgo H. et al. "Optimization of DC Reactive Magnetron Sputtering Deposition Process for Efficient YSZ Electrolyte Thin Film SOFC" IN: Fuel Cells, Apr. 1, 2013, vol. 13, No. 2, pp. 279-288.
Thiele E.S. et al. "Deposition and properties of yttria-stabilized zirconia thin films using reactive direct current magnetron sputtering" IN: Journal of Vacuum Science & Technology A 9 (6), 1991, pp. 3054-3060.
Jankowski A.F. et al. "Reactive sputter deposition of yttria-stabilized zirconia" IN: Surface & Coatings Technology 76-77, 1995, pp. 126-131.
Knoll, R.W. et al. "Correlation Between the Stress and Microstructure in Bias-Sputtrered $ZrO_2$—$Y_2O_3$ Films" IN: Thin Solid Films, 117, 1984, pp. 201-210.
Shaula A.L. et al. "Protective YSZ-based thin films deposited by RF magnetron sputtering" IN: Vacuum 83, 2009, pp. 1266-1269.
Plantin P., et al. "Study of deposition and post-oxidation of d.c. magnetron sputtered W/Fe bilayers" IN: Surface & Coatings Technology 200, 2005, pp. 408-412.
Pilling N.D., et al. "The Oxidation of Metals at High Temperatures" IN: Journal Institute of Metals 29, 1923 pp. 529-591.
Park et al. "Electrical Properties of YSZ Thin Films Deposited on Nanoporous Substrates" IN: The Electrochemical Society Proceedings Volumes, 203-7, p. 169-180.
Ma, C.Y. et al. "$La_{9.33}Si_6O_{26}$ electrolyte thin films for IT-SOFC application deposited by a HIPIMS/DC hybrid magnetron sputtering process" IN: Iconics 14, 2008, pp. 471-476.
Coddett, P. "Planar Solid Oxide Fuel Cell: Electrolute Deposited by Reactive Magnetron Sputtering and Cell Test" IN: Fuel Cells 11(2), 2011, pp. 158-164.

* cited by examiner

FIG. 1A  
1: $O_2 + 4e^- \rightarrow 2O^{2-}$
3: $2H_2 + 2O^{2-} \rightarrow 2H_2O + 4e^-$ FIG. 1B  
1': $H_2O + 2e^- \rightarrow H_2 + O^{2-}$
3': $O^{2-} \rightarrow \frac{1}{2} O_2 + 2e^-$

METHOD FOR MANUFACTURING AN ELECTROLYTE FOR SOLID OXIDE CELLS BY MAGNETRON CATHODE SPUTTERING

CROSS-REFERENCE TO RELATED APPLICATIONS

This is a National Stage application of PCT international application PCT/FR2018/052360, filed on Sep. 25, 2018, which claims the priority of French Patent Application No. 17 58902, filed Sep. 26, 2017, both of which are incorporated herein by reference in their entirety.

TECHNICAL FIELD

The invention relates to the field of electrochemical systems that produce energy or hydrogen.

More specifically, the invention relates to a method that makes it possible to manufacture by magnetron cathode sputtering an electrolyte in the form of a thin, dense, stable film, capable of entering into the composition of solid oxide cells (or SOC) which include solid oxide fuel cells (or SOFC) and solid oxide electrolyser cells (or SOEC).

PRIOR ART

The SOFC are electrochemical cells that produce electrical and thermal energy which use the chemical energy generated by the reaction of the formation of water from hydrogen and oxygen.

Figure 1A:
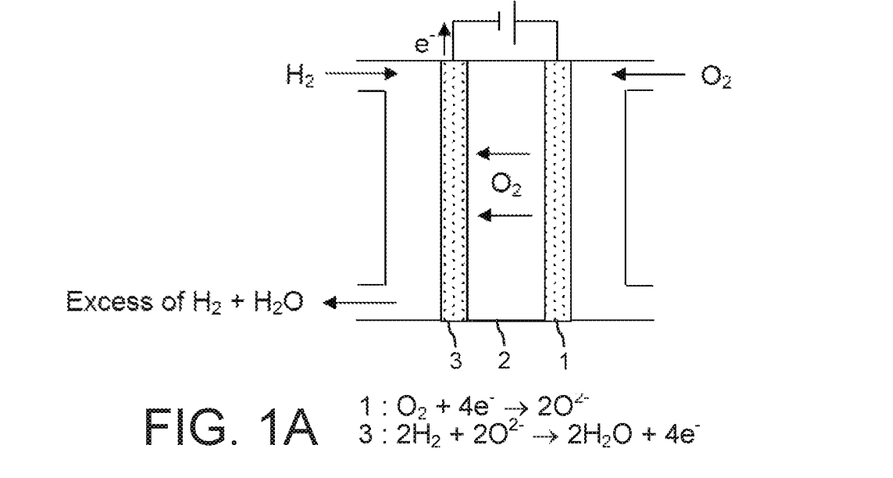
FIG. 1A, already commented on, diagrammatically shows the operating principle of a SOFC.

As can be seen in the accompanying FIG. 1A, the operating principle of an SOFC cell is based on the following mechanism: the oxygen of the air, which is supplied to the cathode 1, is dissociated in order to give anions $O^{2-}$. The anions thus formed migrate through the electrolyte 2 until they reach the anode 3 at which they oxidise the atoms of hydrogen which are supplied by the fuel. This reaction releases electrons and water.

SOECs are electrochemical cells that produce hydrogen of which the operating principle is strictly the inverse of that of SOFCs.

Figure 1B:
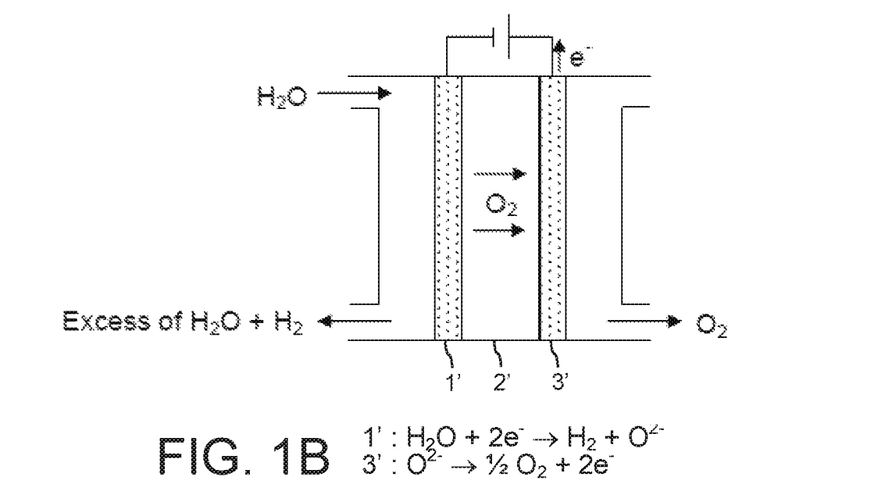
FIG. 1B, already commented on, diagrammatically shows the operating principle of a SOEC.

Indeed, as can be seen in the accompanying FIG. 1B, in the case of a SOEC cell, steam is supplied to the cathode 1' and the water molecules are dissociated into hydrogen and into $O^{2-}$ anions. The anions thus formed diffuse through the electrolyte 2' to combine together again in the form of oxygen at the anode 3' while the hydrogen remains, with the steam, at the cathode. This hydrogen can then be recovered to be used as a fuel in other applications.

To manufacture such electrochemical cells, the obtaining of electrolytes that have the form of thin and dense films (in order to be gas tight) is required. The more an electrolyte meets these criteria, the lower the ohmic drop in the electrolyte is and the higher the voltage at the abandon of the electrochemical cell is. This makes it possible, in both cases, to increase the global electrochemical performance.

Currently, the most used electrolyte material is yttria-stabilised zirconia (or YSZ).

The elaboration of electrolytes in the form of thin films, and in particular of thin films of YSZ, by magnetron cathode sputtering—which is a technique known to allow for deposits of a few µm in thickness—has given rise to a certain number of works, and this, with direct current (cf., for example, E. S. Thiele et al., *Journal of Vacuum Science and Technology A* 9(6), 1991, 3054-3060, hereinafter referenced as [1]; A. F. Jankowski and J. P. Hayes, *Surface and Coatings Technology*, 76-77, 1995, 126-131, hereinafter referenced as [2]) as well as with radiofrequency (cf., for example, R. W. Knoll and E. R. Bradley, *Thin Solid Films* 117, 1984, 201-210, hereinafter referenced as [3]; A. L. Shaula et al., *Vacuum* 83, 2009, 1266-1269, hereinafter referenced as [4]).

Recall that the principle of cathodic sputtering is the ejection of atoms or of molecules of a target under the effect of the bombarding by ions created in a gas plasma and accelerated in an electric field. The atoms of the target material, having reacted or not with a reactive gas associated with the plasma gas, are deposited on a substrate placed facing the target. The magnetron cathodic sputtering is a version of this technique wherein a set of magnets (or magnetron) is added behind the target making it possible to increase the deposition speed by confining of the plasma.

When the deposition of a material, such as an oxide, is carried out using a metal target in a plasma comprised of a plasma gas and a reactive gas ($O_2$ for an oxide), this is referred to as reactive sputtering.

In this case, two operating modes exist according to the proportion of the reactive gas in relation to the plasma gas: a mode referred to as "elemental sputtering", or "metal mode", with a low proportion of reactive gas, which results in a metal deposition, and a mode referred to as "sputtering of the compound", or "compound mode", with a high proportion of reactive gas, which results in a deposition of the most stable compound coming from the reaction between the reactive gas and the metal forming the target. The transition from one mode to the other is done at a certain flow rate of the reactive gas which depends on the characteristics of the sputtering chamber (dimensions, volume, etc.), of the pumping system with which this chamber is provided and of the sputtering conditions. This transition has a hysteresis, i.e. the passage from the "metal mode" to the "compound mode" does not take place at the same flow rate of reactive gas as that from the "compound mode" to the "metal mode". Certain magnetron sputtering devices, which are provided with control systems of the gas phase (for example, by optical emission spectroscopy) or characteristics of the discharge (such as the cathode voltage), and with a regulation loop, which however allows for operation in an intermediate sputtering mode. In this case, the deposits are partially oxidised.

The sputtering mode of the compound is, in general, little used to elaborate films with a thickness exceeding 1 micrometre due to its low deposition speed and substantial constraints caused by the accumulation of defect in the layers obtained.

The elemental and transition sputtering modes, which have a deposition speed of a higher order, are generally preferred to it. In these modes, the film formed on the substrate contains the metal precursor of the target and a proportion of oxygen that varies according to the sputtering conditions and the flow rate of the reactive gas, but which remains less than the stoichiometric proportion obtained in sputtering mode of the compound.

In particular, the elemental sputtering mode makes it possible to obtain relatively dense films at a deposition speed that is compatible with the industrial constraints. However, it is then necessary to subject these films to a thermal treatment under air to, on the one hand, allow for a reaction of the material that forms these films (oxygen deficiency) with the oxygen of the air, (cf. P. Plantin et al., *Surface & Coatings Technology* 200, 2005, 408-412, hereinafter referenced as [5]) and, on the other hand, improve the crystalline quality thereof.

However, the application of a thermal treatment to films with a relatively substantial thickness (i.e., from 1 µm to 10 µm in the case of an electrolyte film for SOC) leads to stress fractures and to a delamination of the films if these films are dense. By way of example, the volume expansion rate (or Pilling and Bedworth ratio) is 1.57 for passing from zirconium to zirconia (cf. N. D. Pilling and R. E. Bedworth, *Journal Institute of Metals* 29, 1923, 529, hereinafter referenced as [6]) and close to 1.45 for a yttria-stabilised zirconia with a mass proportion of 15% yttrium (cf. Y. I. Park et al., in: S. C. Singhal, M. Dokiya (EDs.), *ECS Proc. SOFC VIII*, 7, 2003, 169, hereinafter referenced as [7]). This volume expansion leads to an increase in the thickness of the films, increase which is, for example, close to 30% for La—Si—O films (cf. C. Y. Ma et al., *Ionics* 14, 2008, 471, hereinafter referenced as [8]).

In order to overcome these disadvantages, it is possible to reduce the thickness of the films so as to limit the risks of delamination. Another solution consists of modifying the parameters for elaborating films is such a way as to manufacture films that are less dense that will withstand the volume expansion induced by the thermal treatment. In this case, the purpose is to transform films that are relatively little dense after the deposition thereof into films that have a higher density after the thermal treatment and, therefore, good impermeability to gases which are used in SOCs (cf. P. Coddet et al., *Fuel Cells* 11(2), 2011, 158-164, hereinafter referenced as [9]). However, the delicate management of this volume expansion leads to a tightness to gas of the films which is insufficient for the operation of a SOC.

Moreover, the other thin layer deposition techniques, such as screen printing, chemical vapour deposition (or CVD) and atomic layer deposition (or ALD) techniques, are not suitable for the production of films that have both the thickness and the density required for electrolyte films for SOC.

In light of the above, the Inventors have set the goal of providing a method that makes it possible to manufacture electrolyte films for SOC and which is, generally, free from the disadvantages presents by the methods proposed to date.

More specifically, they have set the goal for this method to make it possible to manufacture electrolyte films for SOC that meet the requirements of thickness and of density (and, therefore, of tightness to gases) required for this type of electrochemical cells and this, without the risk of stress fractures or delamination.

They have in addition set the goal that this method be easy to adapt to the nature and to the behaviour of the materials used for the manufacture of electrolyte films for SOC.

They have in addition set the goal that this method be compatible with the Industrial constraints in terms of costs and timeframes in such a way as to be able to be implemented for the manufacture of SOC on an industrial scale.

DISCLOSURE OF THE INVENTION

All of these goals are achieved by the invention which proposes a method for manufacturing an electrolyte in the form of a film for solid oxide electrochemical cells, characterised in that it comprises steps of:
heating a substrate to a temperature ranging from 200° C. to 1,200° C.; then
subjecting the substrate to at least two treatment cycles, each treatment cycle comprising:
1) depositing one layer of a metal precursor on the substrate by magnetron cathode sputtering of a target consisting of the metal precursor, the sputtering being carried out under elemental sputtering conditions; then
2) oxidation-crystallisation of the metal precursor forming the layer deposited on the substrate in the presence of oxygen to obtain the transformation of the metal precursor into the electrolyte material;
and in that the substrate is kept at a temperature ranging from 200° C. to 1,200° C. for the entire duration of each treatment cycle.

In what follows, the expressions "from . . . to . . . ", "ranging from . . . to . . . " and "comprised between . . . and . . . " are equivalent and are intended to means that the limits are included.

Moreover, the terms "elemental sputtering conditions" are taken in their general acceptance in the field of reactive cathodic sputtering, namely this relates to conditions wherein the sputtering results in a metal deposition. These conditions are obtained for a flow rate of reactive gas that is below a critical value, which can easily be determined by establishing, for the cathodic sputtering chamber wherein it is intended to carry out the sputtering, the hysteresis curve. This curve can be established by studying the change in an electrical parameter such as the voltage or the power at the target, or the change in the pressure prevailing in the cathodic sputtering chamber according to the flow rate of reactive gas, in the operating conditions chosen for implementing the sputtering.

In accordance with the invention, the substrate is, preferably, heated and kept at a temperature ranging from 450° C. to 850° C. for the entire duration of each treatment cycle.

According to a first embodiment of the method of the invention, each treatment cycle is carried out in a magnetron cathodic sputtering chamber in which the heated substrate and the target are located and in which a pressure prevails, in which case each treatment cycle comprises the steps of:
supplying the sputtering chamber with a plasma gas at a flow rate $D_P1$;
adjusting the pressure prevailing in the sputtering chamber to a value ranging from 0.1 Pa to 10 Pa and, preferably, from 0.2 Pa to 2 Pa;
starting the sputtering of the target;
supplying the sputtering chamber with oxygen at a flow rate $D_R1$ lower than the flow rate $D_P1$ while still keeping the pressure prevailing in the sputtering chamber at the value ranging from 0.1 Pa to 10 Pa in order to create elemental sputtering conditions;
keeping the elemental sputtering conditions for a time sufficient to obtain the formation of the layer of the metal precursor on the substrate;
stopping the sputtering of the target;
increasing the flow rate $D_R1$ in order to obtain a supply flow rate of the sputtering chamber with oxygen $D_R2$, stopping the supplying of the sputtering chamber with plasma gas or reducing the flow rate $D_P1$ in order to obtain a supply flow rate of the sputtering chamber with plasma gas $D_P2$ at most equal to ½ of $D_R2$ and, preferably, at most equal to ¹⁄₁₀ of $D_R2$, and adjusting the pressure prevailing in the sputtering chamber to a value at least equal to 10 Pa and, preferably, ranging from 10 Pa to 500 Pa, in order to create oxidation-crystallisation conditions of the metal precursor forming the layer deposited on the substrate;
keeping the oxidation-crystallisation conditions for a time sufficient to obtain the transformation of the metal precursor forming the layer deposited on the substrate into the electrolyte material by oxidation-crystallisation of the metal precursor; and stopping the supplying of the sputtering chamber with oxygen.

In this first embodiment:

the substrate is advantageously kept at a constant temperature for the entire duration of each treatment cycle, which temperature is, preferably, comprised between 450° C. and 850° C.;

the flow rate $D_P1$ is, preferably, comprised between 1 sccm (Standard Cubic Centimetre per Minute) and 500 sccm and, even better, between 5 sccm and 50 sccm;

the flow rate $D_R1$ is, preferably, at most equal to 100 sccm and, even better, at most equal to 10 sccm, while the flow rate $D_R2$ is more preferably comprised between 10 sccm to 500 sccm and, even better, between 20 sccm and 200 sccm, with the understanding that, as stated hereinabove, $D_R1$ must be lower than $D_P1$ while $D_R2$ must be greater than $D_R1$.

Moreover, the elemental sputtering conditions are, preferably, kept for 1 minute to 120 minutes and, even better, for 10 minutes to 60 minutes, while the oxidation-crystallisation conditions are, preferably, kept for 1 minute to 60 minutes and, even better, for 1 minute to 5 minutes.

According to a second embodiment of the method of the invention, each treatment cycle is carried out in two different chambers, the depositing being carried out in a first chamber which is a magnetron cathodic sputtering chamber in which elemental sputtering conditions prevail, and the oxidation-crystallisation being carried out in a second chamber in which oxidation-crystallisation conditions prevail, in which case each treatment cycle comprises in addition, between the depositing and the oxidation-crystallisation, the transfer of the substrate from the first chamber to the second chamber.

In this second embodiment:

the elemental sputtering conditions are a pressure prevailing in the first chamber comprised between 0.1 Pa and 10 Pa and, preferably, between 0.2 Pa and 2 Pa, a supplying of the first chamber with a plasma gas at a flow rate $D_P1$ and a supplying of the first chamber with oxygen at a flow rate $D_R1$ lower than the flow rate $D_P1$; while the oxidation-crystallisation conditions are a pressure prevailing in the second chamber at least equal to 10 Pa and, preferably, comprised between 10 Pa and 500 Pa, a supplying of the second chamber with oxygen at a flow rate $D_R2$ greater than the flow rate $D_R1$, and possibly a supplying of the second chamber with plasma gas at a flow rate $D_P2$ at most equal to ½ of $D_R2$ and, preferably, at most equal to ⅒ of $D_R2$.

Here also, the flow rate $D_P1$ is, preferably, comprised between 1 sccm and 500 sccm and, even better, between 5 sccm and 50 sccm; the flow rate $D_R1$ is, preferably, at most equal to 100 sccm and, even better, at most equal to 10 sccm, while the flow rate $D_R2$ is preferably comprised between 10 sccm to 500 sccm and, even better, between 20 sccm and 200 sccm, with the understanding that, as stated hereinabove, $D_R1$ must be lower than $D_P1$ while $D_R2$ must be greater than $D_R1$.

Moreover, the substrate is, preferably, kept in the first chamber for 1 minute to 120 minutes and, even better, for 10 minutes to 60 minutes, while the substrate is, preferably, kept in the second chamber for 1 minute to 60 minutes and, even better, for 1 minute to 5 minutes.

In the second embodiment, it is possible to use only two different chambers, one dedicated to the deposition of layers of metal precursor and the other dedicated to the oxidation-crystallisation of the metal precursor forming these layers, in which case each treatment cycle except for the last cycle comprises in addition, at the end of the oxidation-crystallisation, the transfer of the substrate from the second chamber to the first chamber. Thus, it can in particular be two chambers which are connected together by a transfer line allowing for the transfer of the substrate from one chamber to the other but which are separated from one another by an airlock that makes it possible to keep constant the temperature, pressure and atmosphere conditions prevailing in each chamber and wherein the substrate transits during the transfer thereof from one chamber to the other.

It is also possible to use a continuous treatment device comprising a succession of different chambers, of which one out of two is dedicated to the deposition of the layers of the metal precursor and one out of two is dedicated to the oxidation-crystallisation of the metal precursor forming these layers. Here also, these different chambers can be connected together by a set of transfer lines while still being separated from one another by airlocks.

This second embodiment can be particularly interesting, in particular for an implementation on an industrial scale, because:

it offers the possibility of using different temperatures for the deposition and for the oxidation-crystallisation, with the understanding that these temperatures must be comprised between 200° C. and 1,200° C. and are preferably comprised between 450° C. and 850° C.;

it makes it possible to suppress the waiting time that impose the rising and lowering in pressure as well as the adjusting of the flow rates of plasma gas and of reactive gas which are required to institute elemental sputtering and oxidation-crystallisation conditions in the case of the use of a single chamber;

it makes it possible to prevent the temperature, pressure and atmosphere conditions, wherein the oxidation-crystallisation is carried out, from affecting the target, in particular via oxidation; and it offers the possibility of subjecting in parallel substrates to a depositing and substrates to an oxidation-crystallisation in the case of a continuous treatment.

Regardless of the embodiment, the method of the invention comprises, preferably, from 2 to 20 and, even better, from 2 to 5 treatment cycles.

In accordance with the invention, the electrolyte material can be any material of which the use has been proposed for the carrying out of electrolytes for SOC such as a mixture of oxides of formula $MO_2$-$M'O_3$ where M represents zirconium or cerium while M' represents yttrium, scandium or an element from the group of lanthanides, a ceria of formula $Ce_{1-x}M_xO_{2-\delta}$ wherein M represents samarium, gadolinium or yttrium, an oxide of a perovskite structure based on $LaGaO_3$ and wherein the lanthanum can be partially substituted by strontium, calcium or barium while the gallium can be partially substituted by magnesium and/or cobalt or iron, or an apatite of formula $La_{10-x}M_x(Si_{1-y}M'_yO_4)_6O_{2\pm\delta}$ wherein M represents strontium, calcium or barium while M' represents aluminium, germanium or magnesium.

However, it is preferred that this mixture be a mixture of oxides of formula $MO_2$-$M'O_3$ where M represents zirconium or cerium and M' represents yttrium, scandium or an element from the group of lanthanides and, furthermore, a yttria-stabilised zirconia.

Therefore, the target is, preferably, a target comprising a mixture M-M' wherein M represents zirconium or cerium and M' represents yttrium, scandium or a lanthanide, and, furthermore, a mixture of zirconium and yttrium, for example in a mass ratio of 82/18.

The plasma gas is typically a neutral gas, preferably argon.

As for the substrate, it can be formed from a film of an electrode material (positive or negative) for SOC, itself disposed on a film of an interconnection material for SOC.

In addition to the aforementioned advantages, the method of the invention further comprises other advantages of which those of:

- making it possible to carry out the depositing of the layers of the metal precursor at a high speed (>250 nm/h) and obtaining layers with a thickness lower than 2-3 µm;
- making it possible, through a measurement of the pressure prevailing in the chamber in which the oxidation-crystallisation is carried out, to follow the degree of oxidation of the metal precursor and, therefore, to optimise this degree of oxidation by adjusting the duration of this step;
- preventing recourse to a later thermal treatment which could lead to a delamination and a cracking of the films due to the stress;
- leading to films that have a leakage rate of the same magnitude as the one of films 4 times thicker, manufactured conventionally (cf. II.2 hereinafter);
- being able to be implemented on a single site and by means of a single piece of equipment, which limits the handling of the films; and
- being able to be integrated into a method of manufacturing SOC electrochemical cells by magnetron cathode sputtering.

Other characteristics and advantages of the invention shall appear in the following complement of the description and which refers to the accompanying figures.

Of course, this complement of the description is provided solely for the purposes of illustrating the purpose of the invention and does not form in any case a limitation of this purpose.

DETAILED DISCLOSURE OF PARTICULAR EMBODIMENTS

I—Block Diagram of an Embodiment

Figure 2:
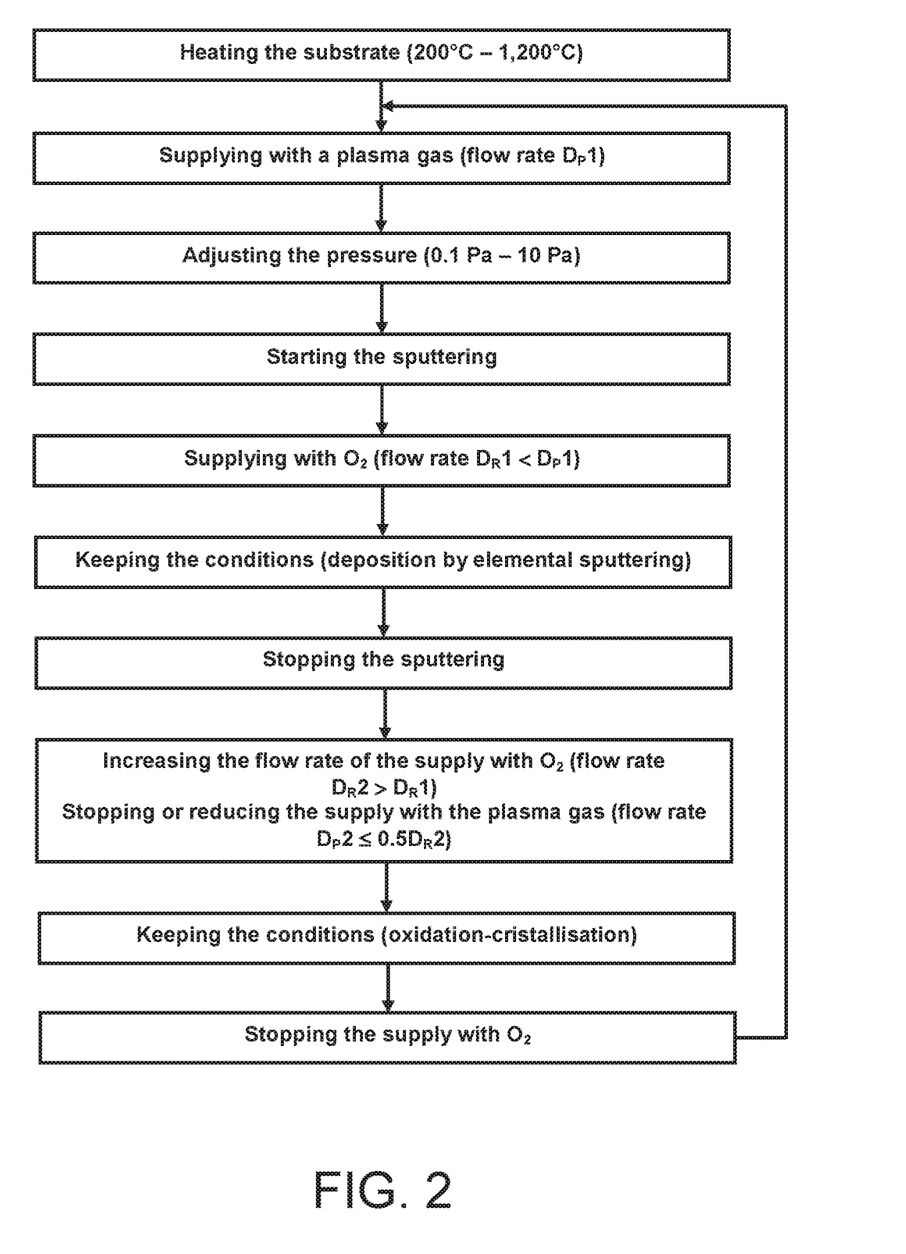
FIG. 2 diagrammatically shows an embodiment of the method of the invention wherein each treatment cycle is carried out in a single chamber which is a magnetron sputtering.

Reference is made to FIG. 2 which diagrammatically shows an embodiment of the method according to the invention wherein each treatment cycle to which the substrate is subjected is carried out in the sputtering chamber of a PVD deposition machine by magnetron cathode sputtering.

As can be seen in this figure, the first step of the method consists of heating the substrate, fastened beforehand onto the substrate holder of the sputtering chamber, to bring the temperature of this substrate to a temperature ranging from 200° C. to 1,200° C. and, preferably, from 450° C. to 850° C. This heating can be, for example, carried out by means of a heating module with which the sputtering chamber is provided.

Once the desired temperature of the substrate is reached, then begins the first treatment cycle of the substrate with successively and in this order:

a) supplying the sputtering chamber with a plasma gas at a flow rate $D_P1$, the plasma gas being typically a neutral gas, preferably argon, and the flow rate $D_P1$ being, preferably, comprised between 1 sccm and 500 sccm and, even better, between 5 sccm and 50 sccm;

b) adjusting the pressure prevailing in the sputtering chamber to a value ranging from 0.1 Pa to 10 Pa, with this adjustment being carried out by means of the pumping system with which the sputtering chamber is provided;

c) starting the sputtering of the target formed from the metal precursor that is to be deposited onto the substrate by starting the electric generator associated with the target;

d) supplying the chamber with oxygen at a flow rate $D_R1$ lower than the flow rate $D_P1$, the flow rate $D_R1$ being, preferably, at most equal to 100 sccm and, even better, at most equal to 10 sccm, while keeping the pressure prevailing in the chamber at the value to which it was adjusted in step b), in such a way as to institute elemental sputtering conditions in the sputtering chamber;

e) keeping elemental sputtering conditions for a time that is sufficient to obtain the formation of the layer of the metal precursor on the substrate, this time able to range from 1 min to 120 min according to the nature of the metal precursor and of the thickness of the layer that it sought to be deposited;

f) stopping the sputtering of the target;

g) increasing the supply flow rate $D_R1$ of the sputtering chamber with oxygen—this flow rate being, preferably, brought to a value $D_R2$ ranging from 10 sccm to 500 sccm and, even better, ranging from 20 sccm to 200 sccm—, stopping the supplying of the sputtering chamber with plasma gas or reducing the flow rate $D_P1$ in order to obtain a supply flow rate of the sputtering chamber with plasma gas $D_P2$ at most equal to half of $D_R2$ and, preferably, at most equal to one-tenth of $D_R2$, and adjusting the pressure prevailing in the sputtering chamber to a value at least equal to 10 Pa, typically from 10 Pa to 500 Pa, in order to create oxidation-crystallisation conditions of the metal precursor forming the layer deposited on the substrate, the adjusting of the pressure being carried out by reducing, even stopping the pumping;

h) keeping the oxidation-crystallisation conditions for a time that is sufficient to transform the metal precursor forming the layer deposited on the substrate into the electrolyte material by oxidation-crystallisation of the metal precursor, this time being able to range from 1 min to 60 min; and i) stopping the supplying of the sputtering chamber with oxygen.

After a waiting time, typically, from 30 s to 600 s, in order to allow for a deoxidation of the target, the substrate is subjected to a new treatment cycle identical to the one that has just been described, and this, one or more times, preferably, from 1 to 20 times according to the thickness that the electrolyte film must have in the end, this thickness ranging typically from 1 µm to 10 µm, and/or according to the stoichiometry in oxygen or the degree of oxidation-crystallisation that is sought to be conferred to this film (cf. point II.2 hereinafter).

As known per se, a protective cover is advantageously disposed between the target and the substrate so as to protect this substrate during all the steps other than the step of deposition of the layer of the precursor material on the substrate, i.e. the step e) of each cycle.

II—Experimental Validation

II.1—Manufacture of YSZ Films:

YSZ films are manufactured by applying the embodiment described in point I hereinabove in a magnetron sputtering chamber with a volume of 35 litres (APRIM VIDE COMPANY) provided with a 4-inch magnetron, a Pinnacle™+ (ADVANCED ENERGY) pulse generator and a metal target comprised of zirconium and yttrium in a mass ratio of 82/18 and purity equal to 99.9%.

The chamber is connected via a slide valve (HVA) to a pumping system comprised of a dry pump XDS-5 (EDWARDS Limited) and of a turbo-molecular pump ATH 400M (ADIXEN).

The gas flow rates are controlled by mass flow rate regulators (BRONKHORST) and the pressure prevailing in the sputtering chamber is measured by a Pirani/cold cathode (ALCATEL ACC 1009) combined gauge and a capacitive (PFEIFFER CCR 375) gauge.

The substrates used are, on the one hand, silicon wafers and, on the other hand, films of a porous electrode material that are films of a yttria-(or NiO-YSZ)-doped nickel and zirconia cermet manufactured conventionally by tape casting and screen printing.

Each one of these substrates is subjected to 3 treatment cycles by using the following conditions:

For the Deposition of the Layers of ZrY (Step e):
Temperature at the substrate holder: 550° C.±10° C.
Distance between the target and the substrate: 127 mm
Intensity of the discharge current on the target: 1.25 A
Voltage of the discharge on the target: −205 V-−160 V
Pulses: 5 µs at 50 kHz
Argon flow rate ($D_P1$): 20 sccm
Oxygen flow rate ($D_R1$): 1 sccm
Pressure prevailing in the chamber: 1 Pa
Deposition time: 20 min for each layer, which is a total deposition time of 60 min for the 3 layers For the Oxidation-Crystallisation of the Layers of ZrY (Step h):
Temperature at the substrate holder: 550° C.±10° C.
Argon flow rate: 0 sccm
Oxygen flow rate ($D_R2$): 15 sccm
Pressure prevailing in the chamber: 10 Pa
Oxidation-crystallisation time: 5 min for each layer, i.e. a total crystallisation-oxidation time of 15 min for the 3 layers.

Figure 3A:
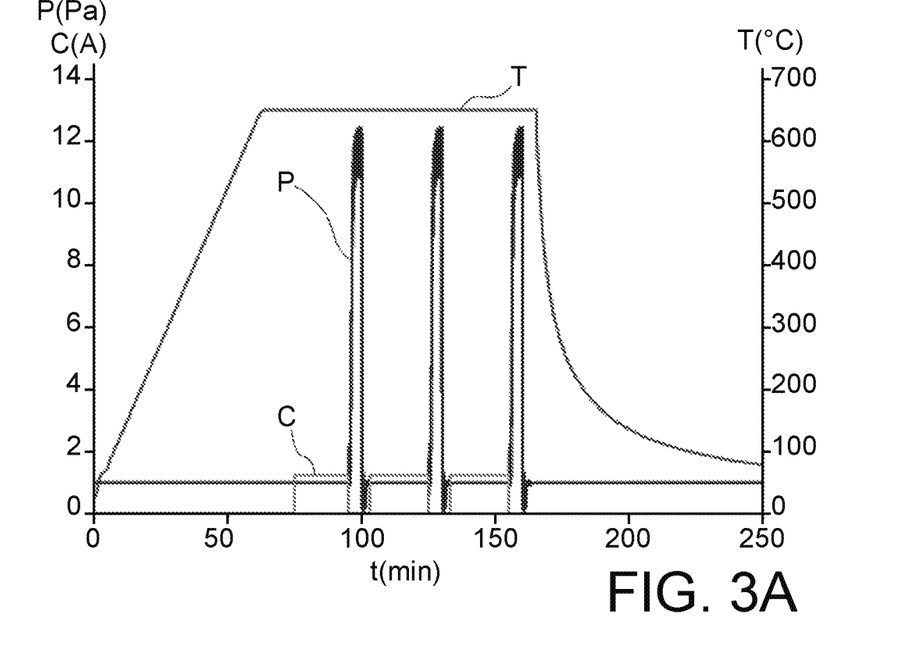
FIG. 3A shows the pressure (curve P), current (curve C) and temperature (curve T) curves as a function of time, noted as t and expressed in min, such as measured during the implementation of the method of the invention according to the mode shown in FIG. 2; in this figure, the pressure values, noted as P and expressed in Pa, and the current values, noted as C and expressed in A, are indicated on the left y-axis while the temperature values, noted as T and expressed in ° C., are indicated on the right y-axis.

FIG. 3A shows the curves of pressure in Pa (curve P), of current in A (curve C) and of temperature in ° C. (curve T) as a function of time, noted as t and expressed in min, such as measured over the 250 min following the starting of the heating of the substrate (which corresponds to the point 0 of the x-axis). Note that, as this figure shows, the heating of the substrate has been stopped and the pressure prevailing in the sputtering chamber brought to 1 Pa at the end of the third treatment cycle.

Figure 3B:
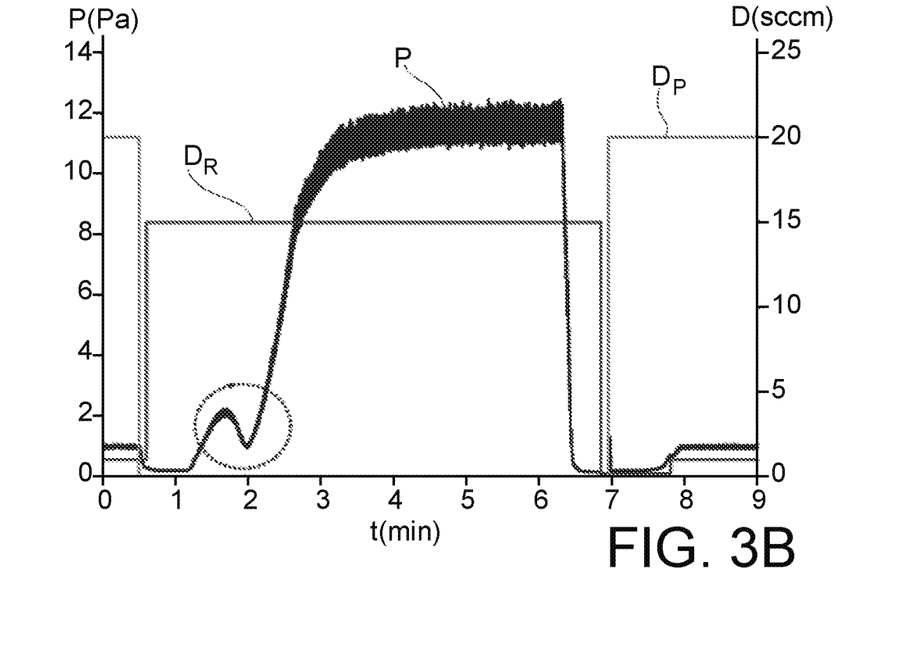
FIG. 3B is an enlargement of the portion located between the dotted line in FIG. 3A; in this figure, are shown the pressure (curve P), argon flow rate (curve $D_P$) and oxygen flow rate (curve $D_R$) curves as a function of time, noted as t and expressed in min, such as measured on this zone; in this figure, the pressure values, noted as P and expressed in Pa, are indicated on the left y-axis while the flow rate values, noted as D and expressed in sccm, are indicated on the right y-axis.

FIG. 3B is an enlargement of the portion located between the dotted line in FIG. 3A, which shows the curves of pressure in Pa (curve P), of argon flow rate in sccm (curve $D_P$) and of oxygen flow rate in sccm (curve $D_R$) as a function of time, expressed in minutes, such as measured on this zone. In this figure, the drop in pressure that can be seen in the dotted circle corresponds to a consumption of oxygen by the metal film deposited beforehand and proves that the metal film is in the process of oxidation The films thus manufactured are subjected to examinations under a scanning electron microscope and the images obtained are compared with those obtained for YSZ films that were manufactured by using the same types of substrates but by proceeding with a conventional depositing by magnetron sputtering. This conventional depositing was carried out in the following elemental sputtering conditions:

Temperature at the substrate holder: not controlled and <200° C.
Distance between the target and the substrate: 127 mm
Intensity of the discharge current on the target: 1.25 A
Voltage of the discharge on the target: ≈−230 V
Pulses: 5 µs at 50 kHz Argon flow rate: 20 sccm
Oxygen flow rate: 3 sccm
Pressure prevailing in the chamber: 1 Pa
Deposition time: 60 min.

Figure 4A:
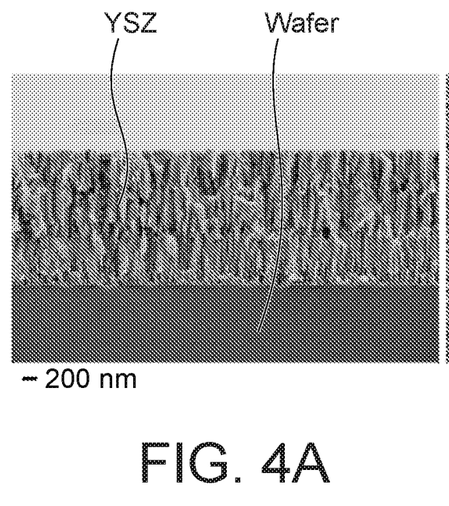
FIGS. 4A and 4B are images taken with the scanning electron microscope (or SEM), at two different magnifications, of an YSZ film manufactured by the method of the invention on a silicon wafer, FIG. 4A being an image of the film seen as a cross-section and FIG. 4B being an image of the film seen from above.
Figure 4B:
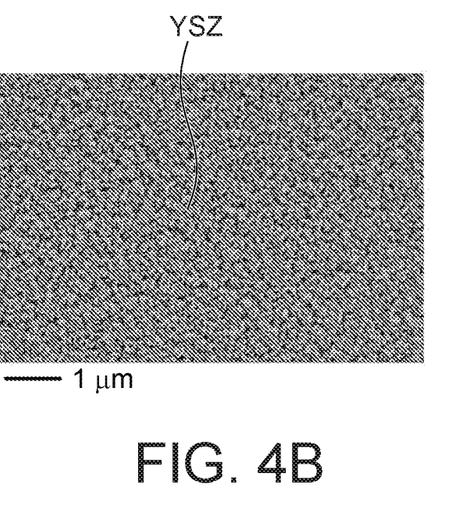
Figure 5A:
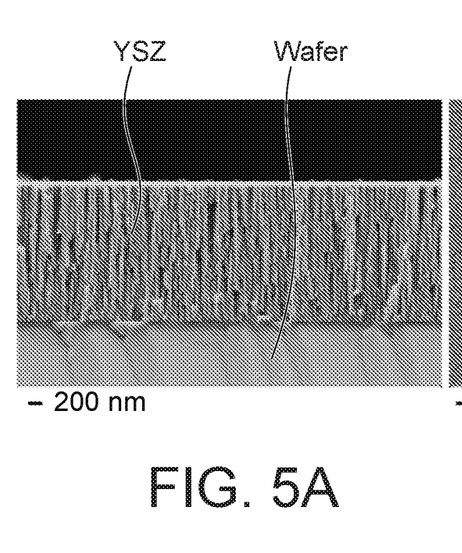
FIGS. 5A and 5B are images taken with the SEM, at two different magnifications, of a YSZ film carried out by conventional deposition by magnetron sputtering on a silicon wafer, FIG. 5A being an image of the film seen as a cross-section and FIG. 5B being an image of the film seen from above.
Figure 5B:
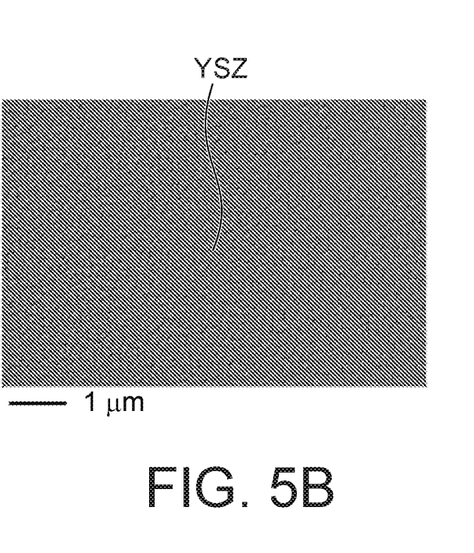
Figure 6A:
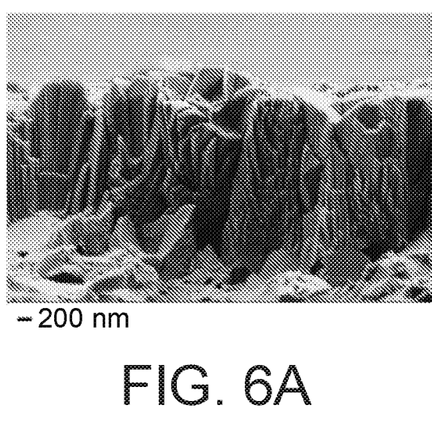
FIGS. 6A and 6B are images taken with the SEM, at two different magnifications, of a YSZ film manufactured by the method of the invention on a film of a porous electrode material NiO-YSZ, FIG. 6A being an image of the film seen as a cross-section and FIG. 6B being an image of the film seen from above.
Figure 6B:
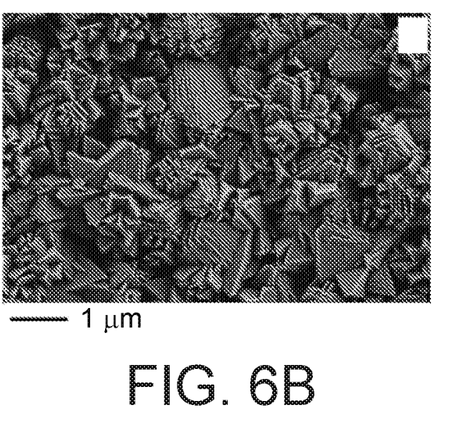
Figure 7A:
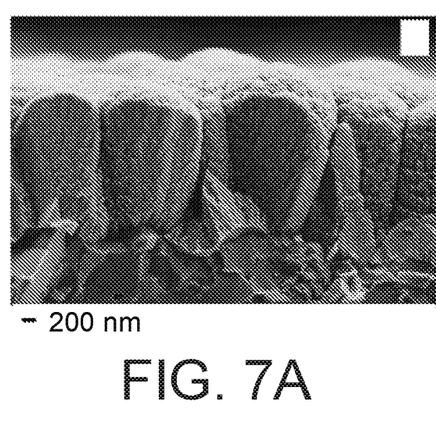
FIGS. 7A and 7B are images taken with the SEM, at two different magnifications, of a YSZ film carried out by conventional deposition by magnetron sputtering on a film of a porous electrode material NiO-YSZ, FIG. 7A being an image of the film seen as a cross-section and FIG. 7B being an image of the film seen from above.
Figure 7B:
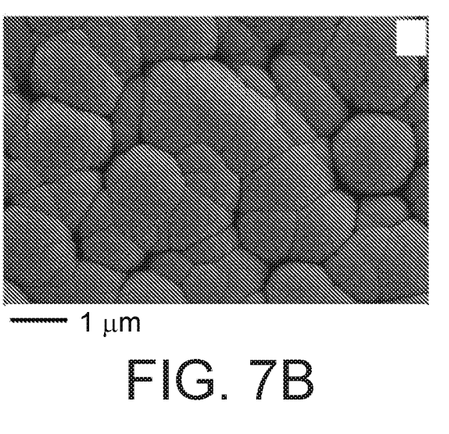

The SEM images of the films manufactured by the method of the invention are shown in FIGS. 4A and 4B on the one hand, and 6A and 6B on the other hand, while the SEM images of the films manufactured by conventional deposition are shown in FIGS. 5A and 5B on the one hand, and 7A and 7B on the other hand.

As these figures show, a continuous columnar structure over the entire thickness is observed for the films manufactured by conventional deposition, while, in the case of the films manufactured by the method of the invention, the deposition/oxidation-crystallisation steps can clearly be distinguished (cf. FIGS. 4A and 4B).

In addition, the films manufactured by the method of the invention have a crystallised structure with the presence of many facets (cf. in particular FIG. 6B) that are not found in the films manufactured by conventional deposition.

Moreover, the permeability to the gases of the films is appreciated by a nitrogen permeability test consisting in imposing an initial pressure difference of $3 \cdot 10^4$ Pa (300 mbar) between the anode and cathode sides of electrochemical cells measuring 60 mm in diameter and having for electrolyte one of these films and in measuring the drop in pressure over time.

Figure 8:
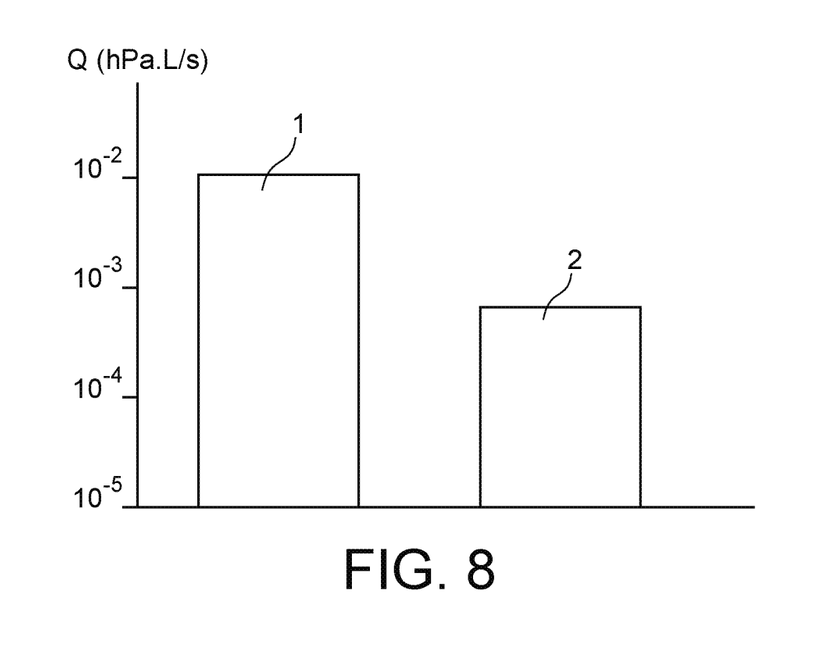
FIG. 8 shows in the form of a bar chart the leakage rate, noted as Q and expressed in hPa·L/s, such as obtained in a nitrogen permeability test for a YSZ film manufactured by the method of the invention (bar on the right) and for a YSZ film of the same thickness carried out by a conventional deposition by magnetron sputtering (bar on the left).

The results of this test are shown in FIG. 8 which shows the leakage rate, noted as Q and expressed as hPa·L/s, such as obtained for two films of YSZ each measuring 1.75 μm thick: one film that was manufactured by the method of the invention (bar on the right) and one film that was manufactured by conventional depositing (bar on the left).

As can be seen in this figure, the leakage rate is $10^{-2}$ hPa·L/s for the film that was manufactured by conventional depositing while this leakage rate is only $6.66 \cdot 10^{-4}$ hPa·L/s for the film that was manufactured by the method of the invention.

The leakage rate obtained for the film that was manufactured by the method of the invention is close to that which typically has a film of YSZ electrolyte for SOC 8 μm thick obtained by screen printing ($10^{-4}$ hPa·L/s).

II.2 Demonstration of the Influence of the Number of Cycles on the Degree of Oxidation-Crystallisation of the Films:

Given that the optical transmission of a film is characteristic of its degree of oxidation-crystallisation, the optical transmission is measured between 350 nm and 1,000 nm for YSZ films that were manufactured by the method of the invention as described in point II hereinabove but by subjecting the substrates to 2, 3 or 4 treatment cycles.

For the purposes of comparison, the optical transmission is also measured in the same wavelength range:
for a YSZ film that was manufactured by a conventional deposition by magnetron sputtering such as described in point II.1 hereinabove,
for a YSZ film that was manufactured by a method that is differentiated from the method of the invention in that it comprises only a single treatment cycle, and
for an entirely oxidised YSZ film, this film was manufactured by a method that is differentiated from the method of the invention in that is comprises only a single treatment cycle, and then thermally treated in an oven under air at 500° C. for 1 min.

Figure 9:
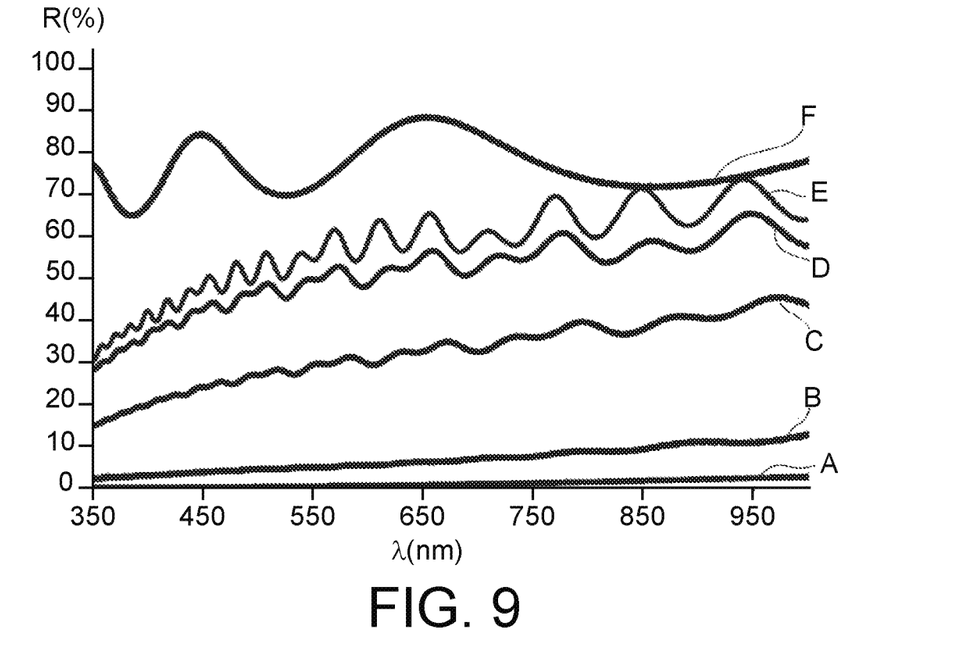
FIG. 9 shows the optical transmission, noted as R and expressed in %, for a wavelength, noted as X and ranging from 350 nm to 1,000 nm, such as obtained for YSZ films manufactured by the method of the invention (curves C, D and E), for a YSZ film carried out by a conventional deposition by magnetron sputtering (curve A), for a film prepared by a method that comprises only one treatment cycle (curve B) for a completely oxidised YSZ film (curve F).

The results of these measurements are shown in FIG. 9 which shows the change in the optical transmission, noted as R and expressed in %, according to the wavelength, noted as X and expressed in nm. In this figure, curve A corresponds to the film that was manufactured by conventional deposition; curve B corresponds to the film that was manufactured by the method that comprises only one treatment cycle; curves C, D and E correspond to the films that were manufactured by the method of the invention, while curve F corresponds to the entirely oxidised film.

As this figure shows, the optical transmission and, therefore, the degree of oxidation-crystallisation of the films that were prepared by the method of the invention (curves C, D and E) is much greater than that of the film that was manufactured by the method that comprises only one treatment cycle (curve B) which itself is much greater than that of the film that was manufactured by conventional deposition (curve A).

Moreover, the optical transmission and, therefore, the degree of oxidation-crystallisation of the films that were manufactured by the method of the invention increases with the number of treatment cycles implemented in this method.

It is therefore possible to confer to an electrolyte film the stoichiometry in oxygen and/or the degree of oxidation desired by adjusting the number of treatment cycles implemented in the method of the invention just as it is possible to adapt the number of treatment cycles according to the tendency that the material forming the film can have to delaminate.

REFERENCES MENTIONED

[1] E. S. Thiele, L. S. Wang, T. O. Mason, S. A. Barnett, *Journal of Vacuum Science and Technology A* 9 (6), 1991, 3054-3060
[2] A. F. Jankowski, J. P. Hayes, *Surface and Coatings Technology* 76-77, 1995, 126-131
[3] R. W. Knoll, E. R. Bradley, *Thin Solid Films* 117, 1984, 201-210
[4] A. L. Shaula, J. C. Oliveira, V. A. Kolotygin, C. Louro, V. V. Kharton, A. Cavaleiro, *Vacuum* 83, 2009, 1266-1269
[5] P. Plantin, A. L. Thomann, P. Brault, B. Dumax, J. Mathias, T. Sauvage, A. Pineau, *Surface & Coatings Technology* 200, 2005, 408-412
[6] N. D. Pilling, R. E. Bedworth, *Journal Institute of Metals* 29, 1923, 529
[7] Y. I. Park, Y. Saito, R. Pornprasertsuk, J. Cheng, S. W. Cha, F. B. Prinz, in: S. C. Singhal, M. Dokiya (EDs.), *ECS Proc. SOFC VIII*, 7, 2003, 169
[8] C. Y. Ma, P. Briois, J. Bohlmark, F. Lapostolle, A. Billard, *Ionics* 14, 2008, 471
[9] P. Coddet, M. C. Pera, A. Billard, *Fuel Cells,* 11(2), 2011, 158-164

What is claimed is:

1. A method for manufacturing an electrolyte in the form of a film for solid oxide electrochemical cells, comprising the steps of:
heating a substrate to a temperature ranging from 200° C. to 1,200° C.; then
subjecting the substrate to at least two treatment cycles, each treatment cycle comprising:
a) depositing one layer of a metal precursor on the substrate by reactive magnetron cathode sputtering of a target consisting of the metal precursor, the sputtering being carried out under elemental sputtering conditions; then
b) oxidation-crystallisation of the metal precursor forming the layer deposited on the substrate in the presence of oxygen to obtain the transformation of the metal precursor into the electrolyte material;

the substrate being kept at a temperature ranging from 200° C. to 1,200° C. for the duration of each treatment cycle;

wherein each treatment cycle is carried out in a magnetron cathodic sputtering chamber in which the heated substrate and the target are located and in which a pressure prevails, and wherein each treatment cycle comprises the steps of:

supplying the sputtering chamber with a plasma gas at a flow rate $D_P1$;

adjusting the pressure prevailing in the sputtering chamber to a value ranging from 0.1 Pa to 10 Pa;

starting the sputtering of the target;

supplying the sputtering chamber with oxygen at a flow rate $D_R1$ lower than the flow rate $D_P1$ while keeping the pressure prevailing in the sputtering chamber at the value ranging from 0.1 Pa to 10 Pa, in order to create elemental sputtering conditions;

keeping the elemental sputtering conditions for a time sufficient to obtain the formation of the layer of the metal precursor on the substrate;

stopping the sputtering of the target;

increasing the flow rate $D_R1$ to obtain a supply flow rate of the sputtering chamber with oxygen $D_R2$, stopping the supplying of the sputtering chamber with plasma gas or reducing the flow rate $D_P1$ to obtain a supply flow rate of the sputtering chamber with plasma gas $D_P2$ at most equal to ½ of $D_R2$ and adjusting the pressure prevailing in the sputtering chamber to a value at least equal to 10 Pa, to create oxidation-crystallisation conditions of the metal precursor forming the layer deposited on the substrate;

keeping the oxidation-crystallisation conditions for a time sufficient to obtain the transformation of the metal precursor forming the layer deposited on the substrate into the electrolyte material by oxidation-crystallisation of the metal precursor; and stopping the supplying of the sputtering chamber with oxygen;

whereby the electrolyte for solid oxide electrochemical cells is obtained.

2. The method of claim 1, wherein the substrate is heated and kept at a temperature ranging from 450° C. to 850° C. for the duration of each treatment cycle.

3. The method of claim 1, wherein the substrate is kept at a constant temperature for the duration of each treatment cycle.

4. The method of claim 1, wherein the flow rate $D_P1$ is comprised between 1 sccm and 500 sccm.

5. The method of claim 1, wherein the flow rate $D_R1$ is at most equal to 100 sccm.

6. The method of claim 1, wherein the flow rate $D_R2$ is comprised between 10 sccm to 500 sccm.

7. The method of claim 1, wherein the elemental sputtering conditions are kept for between 1 minute and 120 minutes and the oxidation-crystallisation conditions are kept for between 1 minute and 60 minutes.

8. A method for manufacturing an electrolyte in the form of a film for solid oxide electrochemical cells, comprising the steps of:

heating a substrate to a temperature ranging from 200° C. to 1,200° C.; then subjecting the substrate to at least two treatment cycles, each treatment cycle comprising:

a) depositing one layer of a metal precursor on the substrate by reactive magnetron cathode sputtering of a target consisting of the metal precursor, the sputtering being carried out under elemental sputtering conditions; then b) oxidation-crystallisation of the metal precursor forming the layer deposited on the substrate in the presence of oxygen to obtain the transformation of the metal precursor into the electrolyte material;

the substrate being kept at a temperature ranging from 200° C. to 1,200° C. for the duration of each treatment cycle;

wherein each treatment cycle is carried out in two different chambers, the depositing being carried out in a first chamber which is a magnetron cathodic sputtering chamber in which elemental sputtering conditions prevail, and the oxidation-crystallisation being carried out in a second chamber in which oxidation-crystallisation conditions prevail;

wherein each treatment cycle further comprises a transfer of the substrate from the first chamber to the second chamber;

wherein the elemental sputtering conditions comprise a pressure prevailing in the first chamber comprised between 0.1 Pa and 10 Pa, a supplying of the first chamber with a plasma gas at a flow rate $D_P1$ and a supplying of the first chamber with oxygen at a flow rate $D_R1$ lower than the flow rate $D_P1$; and wherein the oxidation-crystallisation conditions comprise a pressure prevailing in the second chamber at least equal to 10 Pa and a supplying of the second chamber with oxygen at a flow rate $D_R2$ greater than the flow rate $D_R1$;

whereby the electrolyte for solid oxide electrochemical cells is obtained.

9. The method of claim 8, wherein the flow rate $D_P1$ is comprised between 1 sccm and 500 sccm.

10. The method of claim 9, wherein the flow rate $D_R1$ is at most equal to 100 sccm.

11. The method of claim 8, wherein the flow rate $D_R2$ is comprised between 10 sccm to 500 sccm.

12. The method of claim 8, wherein the substrate is kept in the first chamber for between 1 minute and 120 minutes and is kept in the second chamber for between 1 minute and 60 minutes.

13. The method of claim 1, comprising from 2 to 20 treatment cycles.

14. The method of claim 1, wherein the target comprises a mixture M-M' wherein M is zirconium or cerium and M' is yttrium, scandium or a lanthanide.

15. The method of claim 14, wherein the target comprises a mixture of zirconium and yttrium.

16. The method of claim 8, wherein the substrate is heated and kept at a temperature ranging from 450° C. to 850° C. for the duration of each treatment cycle.

17. The method of claim 8, comprising from 2 to 20 treatment cycles.

18. The method of claim 8, wherein the target comprises a mixture M-M' wherein M is zirconium or cerium and M' is yttrium, scandium or a lanthanide.

19. The method of claim 18, wherein the target comprises a mixture of zirconium and yttrium.

* * * * *